(12) United States Patent
Shan et al.

(10) Patent No.: US 11,604,696 B2
(45) Date of Patent: Mar. 14, 2023

(54) FIELD PROGRAMMABLE GATE ARRAY (FPGA) FOR IMPROVING RELIABILITY OF KEY CONFIGURATION BITSTREAM BY REUSING BUFFER MEMORY

(71) Applicant: WUXI ESIONTECH CO., LTD., Wuxi (CN)

(72) Inventors: Yueer Shan, Wuxi (CN); Yanfeng Xu, Wuxi (CN); Zhenkai Ji, Wuxi (CN); Feng Hui, Wuxi (CN)

(73) Assignee: WUXI ESIONTECH CO., LTD., Wuxi (CN)

(*) Notice: Subject to any disclaimer, the term of this patent is extended or adjusted under 35 U.S.C. 154(b) by 0 days.

(21) Appl. No.: 17/645,314

(22) Filed: Dec. 21, 2021

(65) Prior Publication Data
US 2022/0114052 A1  Apr. 14, 2022

Related U.S. Application Data

(63) Continuation of application No. PCT/CN2021/128327, filed on Nov. 3, 2021.

(30) Foreign Application Priority Data

Aug. 19, 2021 (CN) .......................... 202110953117.1

(51) Int. Cl.
*G06F 11/10* (2006.01)
*G01R 31/3177* (2006.01)
(Continued)

(52) U.S. Cl.
CPC ...... *G06F 11/1068* (2013.01); *G01R 31/3177* (2013.01); *G01R 31/3185* (2013.01);
(Continued)

(58) Field of Classification Search
CPC .. G06F 11/1068; G06F 11/1048; G06F 11/00; G06F 11/16; G06F 11/167;
(Continued)

(56) References Cited

U.S. PATENT DOCUMENTS

| | | | | |
|---|---|---|---|---|
| 7,143,329 B1 * | 11/2006 | Trimberger | ...... | H03K 19/17764 714/766 |
| 7,200,235 B1 * | 4/2007 | Trimberger | ........... | H04L 9/0897 326/38 |

(Continued)

FOREIGN PATENT DOCUMENTS

| | | | | |
|---|---|---|---|---|
| CN | 104636290 A | * | 5/2015 | ......... G06F 15/7871 |
| CN | 109858195 A | | 6/2019 | |
| CN | 111755436 A | | 10/2020 | |

OTHER PUBLICATIONS

Feilen et al., Real-Time Signal Processing on Low-Cost-FPGAs using Dynamic Partial Reconfiguration, 2011, IEEE, pp. 110-113. (Year: 2011).*

*Primary Examiner* — John J Tabone, Jr.
(74) *Attorney, Agent, or Firm* — Bayramoglu Law Offices LLC

(57) ABSTRACT

A field programmable gate array (FPGA) for improving the reliability of a key configuration bitstream by reusing a buffer memory includes a configuration buffer, a configuration memory and a control circuit. The configuration memory includes N configuration blocks. The FPGA stores a key configuration chain by using the configuration buffer and ensures correct content of the key configuration chain through an error correcting code (ECC) check function of the configuration buffer, so that when the FPGA runs normally, a control circuit reads the key configuration chain in the configuration buffer at an interval of a predetermined time and writes the key configuration chain into a corresponding configuration block to update the key configura- (Continued)

tion chain, thereby ensuring accuracy of the content of the key configuration chain and improving running reliability of the FPGA.

11 Claims, 2 Drawing Sheets

(51) Int. Cl.
    *G01R 31/3185*     (2006.01)
    *G06F 11/16*     (2006.01)
    *G06F 11/00*     (2006.01)

(52) U.S. Cl.
    CPC ........... *G01R 31/318516* (2013.01); *G01R 31/318519* (2013.01); *G06F 11/00* (2013.01); *G06F 11/1048* (2013.01); *G06F 11/16* (2013.01); *G06F 11/167* (2013.01)

(58) Field of Classification Search
    CPC ............ G01R 31/3177; G01R 31/3185; G01R 31/318519; G01R 31/318516
    USPC ................................ 714/764, 725, 768, 773
    See application file for complete search history.

(56) References Cited

U.S. PATENT DOCUMENTS

| | | | |
|---|---|---|---|
| 8,183,881 B1* | 5/2012 | Stassart | H03K 19/177 710/72 |
| 8,917,111 B1* | 12/2014 | Puranik | H03K 19/17748 326/38 |
| 9,218,505 B1* | 12/2015 | Wesselkamper | G06F 21/72 |
| 2008/0022186 A1 | 1/2008 | Co et al. | |
| 2014/0133246 A1* | 5/2014 | Kumar | G11C 16/26 365/230.03 |
| 2022/0114052 A1* | 4/2022 | Shan | G01R 31/3177 |

* cited by examiner

FIELD PROGRAMMABLE GATE ARRAY (FPGA) FOR IMPROVING RELIABILITY OF KEY CONFIGURATION BITSTREAM BY REUSING BUFFER MEMORY

CROSS REFERENCE TO THE RELATED APPLICATIONS

This application is the continuation application of International Application No. PCT/CN2021/128327, filed on Nov. 3, 2021, which is based upon and claims priority to Chinese Patent Application No. 202110953117.1, filed on Aug. 19, 2021, the entire contents of which are incorporated herein by reference.

TECHNICAL FIELD

The present invention relates to the field of field programmable gate array (FPGA) technologies, and more particularly, to an FPGA for improving reliability of a key configuration bitstream by reusing a buffer memory.

BACKGROUND

With the development of very large scale integration circuits, FPGA chips have been used more widely due to excellent interface performance, rich logics and IP resources, as well as a flexible and convenient field programmable capability.

The FPGA chip has a configurable module and a wiring resource. When being mapped to the FPGA chip, a user design may determine a function implemented by the configurable module and a wiring path selected by the wiring resource in the FPGA chip by defining the configuration content (the content of a configuration bit), so as to define a function implemented by the FPGA chip. An FPGA design software maps a user design input after being subjected to synthesis, layout and wiring to the FPGA chip, and then generates a bitstream file in a predetermined format according to the used configuration content of the configurable module and the wiring resource. A bitstream can be filled in the configuration content correctly after being downloaded to an FPGA device, and the function of the FPGA chip can be defined. After the download is completed, the function of the user design can be implemented by running the FPGA chip.

The FPGA chip is prone to a single event upset (SEU) problem due to the impact of external factors such as power supply, radiation, electromagnetism, and particle, resulting in upset and error on the configuration content and a fault on a circuit function. Therefore, in the field of the application of high reliability FPGA, improving the reliability of configuration content is an important topic.

SUMMARY

Technical Problem

The FPGA chip is prone to an SEU problem due to the impact of external factors such as power supply, radiation, electromagnetism, and particle, resulting in the upset and error on the configuration content and a fault on a circuit function. Therefore, in the field of the application of high reliability FPGA, improving the reliability of configuration content is an important topic.

Solutions to the Problem

Technical Solution

In view of the problem and technical requirements, the inventor proposes an FPGA for improving reliability of a key configuration bitstream by reusing a buffer memory, and a technical solution of the present invention is as follows.

An FPGA for improving reliability of a key configuration bitstream by reusing a configuration buffer is provided, the FPGA including a configuration buffer, a configuration memory and a control circuit, where the configuration memory at least includes N configuration blocks, the configuration buffer has an error correcting code (ECC) check function, the configuration buffer is connected to write terminals of the configuration blocks;

configuration bitstreams corresponding to a user design are sequentially written into the FPGA in a unit of a configuration chain, each configuration chain includes continuous configuration bits with a predetermined quantity of bits in the configuration bitstreams, and the configuration bitstreams include a key configuration chain set in advance; after each configuration chain is over-written into the configuration buffer for caching, each configuration chain is written into a corresponding configuration block in the configuration memory for storage, and after all the configuration bitstreams are written and before the FPGA runs the user design normally, the configuration buffer stores the key configuration chain; and when the FPGA runs the user design normally, the configuration buffer performs ECC check on the stored key configuration chain, the control circuit reads the key configuration chain in the configuration buffer at an interval of a predetermined time and writes the key configuration chain into the corresponding configuration block to update the key configuration chain.

A further technical solution thereof is that when the configuration bitstreams are written into the FPGA, the lastest written configuration chain is the key configuration chain; and when each configuration chain is written into a corresponding configuration block from the configuration buffer, the configuration buffer stores the configuration chain until the configuration chain is covered by the next written configuration chain, and after all the configuration chains are written, the configuration buffer stores the lastest configuration chain and the lastest configuration chain is directly used as key configuration chain.

A further technical solution thereof is that the configuration buffer is at least connected to a read terminal of the configuration block that stores the key configuration chain;

when each configuration chain is written into a corresponding configuration block from the configuration buffer, the configuration buffer stores the configuration chain until the configuration chain is covered by a next written configuration chain, and after all the configuration chains are written, the configuration buffer stores the lastest configuration chain; and after all the configuration bitstreams are written and before the FPGA runs the user design normally, the control circuit reads the key configuration chain and writes the key configuration chain into the configuration buffer to cover the lastest configuration chain.

A further technical solution thereof is that the configuration buffer is implemented by an ECC memory, the ECC memory stores the key configuration chain and a corresponding check code and performs ECC check on the key configuration chain through a self-contained ECC check function.

A further technical solution thereof is that the configuration buffer is implemented by a memory and an ECC error detection and correction circuit, the memory is configured to store the key configuration chain and a corresponding check code, and the ECC error detection and correction circuit reads the key configuration chain and the check code corresponding to the key configuration chain from memory for checking, corrects an error when a fault is detected, and over-writes the key configuration chain and the check code into the memory.

A further technical solution thereof is that the FPGA further includes a timer connected to the control circuit, where the control circuit updates the key configuration chain according to a delay duration of the timer, and an input clock of the timer comes from the outside of the FPGA or from the inside of the FPGA.

A further technical solution thereof is that when the timer receives an immediate enable signal, the timer immediately triggers the control circuit to update the key configuration chain, where the immediate enable signal comes from the outside of the FPGA or from the user design inside the FPGA.

A further technical solution thereof is that the delay duration of the timer is less than a designed index parameter of the FPGA, and the designed index parameter includes at least one of a mean time between failures (MTBF) or a mean time to failure (MTTF).

A further technical solution thereof is that the input clock of the timer comes from a ring oscillator inside the FPGA, and a frequency of the input clock is adjustable.

A further technical solution thereof is that the control circuit is connected to a built-in boundary scan chain of the FPGA, and the control circuit obtains an external control signal of the FPGA through the built-in boundary scan chain and updates the key configuration chain.

A further technical solution thereof is that the ECC check function of the configuration buffer is implemented based on a Hamming code.

The Advantage of the Present Invention

Advantage

The present invention discloses an FPGA for improving reliability of a key configuration bitstream by reusing a buffer memory. The FPGA stores a key configuration chain by using a configuration buffer and ensures correct content of the key configuration chain through an ECC check function of the configuration buffer, so that when running normally, the FPGA may be configured to update content of the key configuration chain in a configuration memory periodically, thereby ensuring accuracy of the content of the key configuration chain and improving running reliability of the FPGA.

BRIEF DESCRIPTION OF THE DRAWINGS

Description of the Drawings

Figure 1:
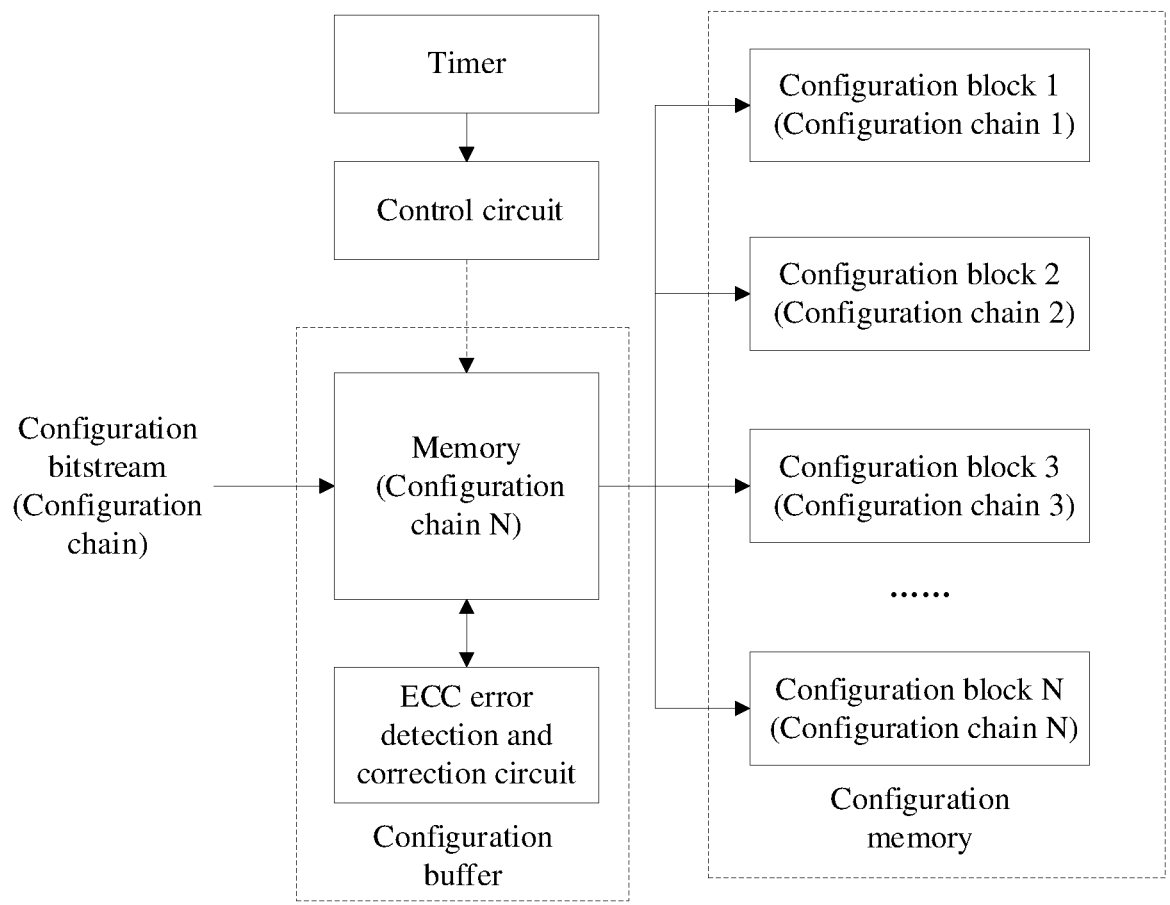

FIG. 1 is an internal structure of an FPGA according to the present application.

Figure 2:
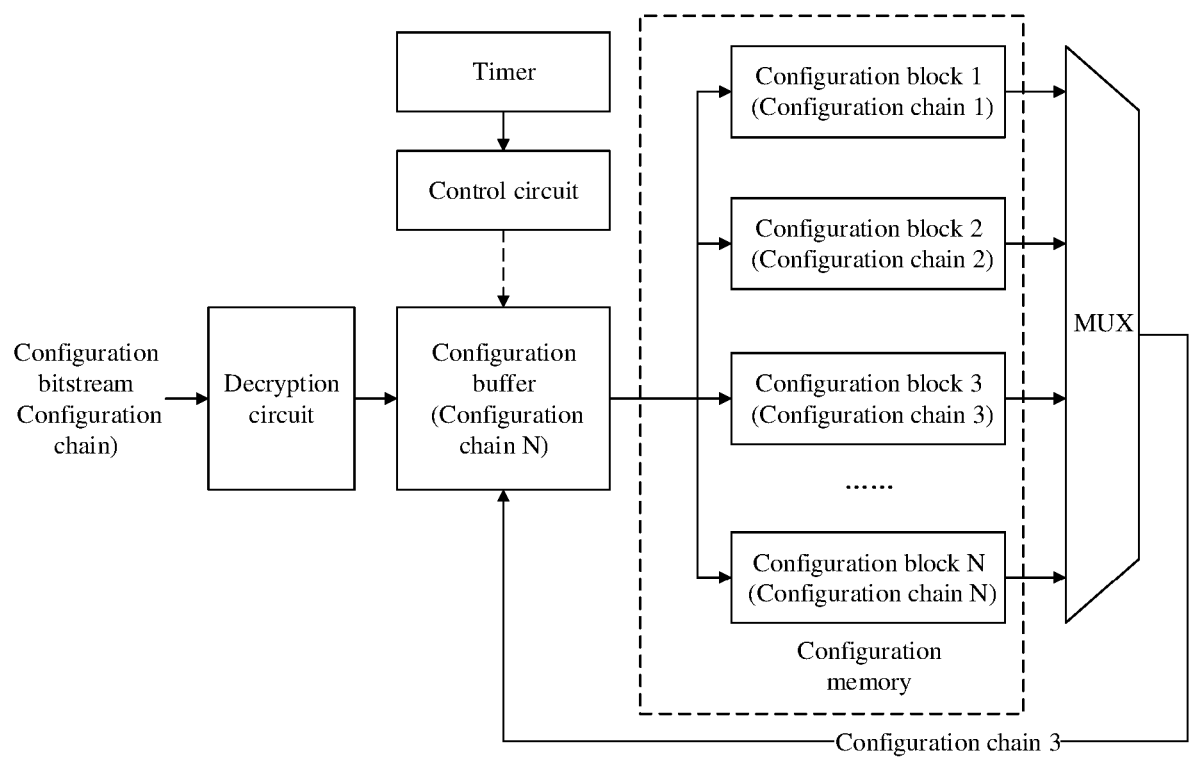

FIG. 2 is another internal structure of an FPGA according to the present application.

DETAILED DESCRIPTION OF THE EMBODIMENTS

Implementations of the disclosure

The specific embodiments of the present invention will be further described with reference to the accompanying drawings.

The present application discloses an FPGA for improving reliability of a key configuration bitstream by reusing a buffer memory. As shown in FIG. 1, the FPGA includes a configuration buffer, a configuration memory, and control circuit. The configuration memory includes N configuration blocks, for example, as shown in FIG. 1, the configuration memory includes the configuration blocks 1 to N, and the configuration buffer is connected to write terminals of the configuration blocks.

Configuration bitstreams corresponding to a user design are sequentially written into the FPGA in a unit of a configuration chain, and each configuration chain includes continuous configuration bits with a predetermined quantity of bits such as 1024 bits or 2048 bits or any self-defined quantity of bits in the configuration bitstreams. A quantity of configuration chains does not exceed a quantity of configuration blocks, for example, the quantity of configuration chains is equal to the quantity of configuration blocks in the present application. The configuration bitstreams include a key configuration chain set in advance, the key configuration chain is a configuration chain that includes a key configuration bitstream set in advance, and the key configuration chain may correspond to any configurable module/wiring resource on the FPGA. The configuration bitstreams written into the FPGA mainly include two packets. The first packet specifies a corresponding stored configuration block, a starting configuration bit, a length, and another related control instruction, and the second packet includes actual content of a configuration bit.

After being written into the FPGA, each configuration chain is first over-written into the configuration buffer for caching, and then each configuration chain is written into a corresponding configuration block in the configuration memory for storage. Therefore, optionally, a width of the configuration block is greater than or equal to a width of the configuration chain, and widths of the configuration blocks may be the same or may be different and generally are the same. When each configuration chain is written into a corresponding configuration block from the configuration buffer, the configuration buffer stores the configuration chain until the configuration chain is covered by a next written configuration chain. For example, a configuration chain 1 is written into the configuration buffer for caching, and then is written into a configuration block 1 for storage. In this case, the configuration buffer stores the configuration chain 1. A configuration chain 2 is written into the configuration buffer to replace the configuration chain 1 for caching and then is written into a configuration block 2 for storage. In this case, the configuration buffer stores the configuration chain 2, and so on, until a configuration chain N is written into the configuration buffer for caching, and then is written into a configuration block N for storage. After all the configuration chains are written, the configuration buffer stores the lastest configuration chain, i.e., the configuration chain N, as shown in FIG. 1. Optionally, as shown in FIG. 2, the FPGA further includes a decryption circuit. A configuration bitstream written into the FPGA may be an encrypted configuration bitstream, and the configuration bitstream written into the FPGA in a unit of a configuration chain is written into the configuration buffer for caching after being decrypted through the decryption circuit.

In the present application, after all the configuration bitstreams are written and before the FPGA runs the user design normally, the configuration buffer stores the key configuration chain in two implementations.

1. When configuration bitstreams corresponding to the user design are generated, a sequence of a configuration chain is adjusted, so that a key configuration chain is the lastest configuration chain of the configuration bitstreams, for example, in FIG. 1, the configuration chain N is the key configuration chain. Therefore, when the configuration bitstreams are written into the FPGA, the lastest written configuration chain is the key configuration chain. After each configuration chain is over-written into the configuration buffer for caching and then is written into the configuration memory, the configuration buffer stores the lastest configuration chain. Therefore, after all the configuration chains are written, the configuration buffer stores the lastest configuration chain and the lastest configuration chain is directly used as the key configuration chain. Because the configuration bitstreams that are directly downloaded and written are stored in the configuration buffer, the key configuration chain stored in the configuration buffer is correct.

2. When configuration bitstreams corresponding to the user design are generated, a sequence of a configuration chain does not need to be adjusted in advance, and a key configuration chain may be at any position. In this case, the key configuration chain may be exactly at a position of the lastest configuration chain in a special case, which is similar to the first embodiment. Generally, the key configuration chain is located in the first or at a middle position. For example, a third configuration chain that is written in sequence, i.e., a configuration chain 3, is the key configuration chain. After all the configuration chains are written, the lastest configuration chain stored in the configuration buffer is the configuration chain N but is not the key configuration chain. In this case, the configuration buffer is at least connected to a read terminal of a configuration block storing the key configuration chain. The configuration buffer may be connected to a read terminal of only one configuration block or may be connected to read terminals of a plurality of configuration blocks by a multiplexer (MUX). For example, in FIG. 2, the configuration buffer is connected to N configuration blocks by the MUX. Similarly, when each configuration chain is written into a corresponding configuration block from the configuration buffer, the configuration buffer stores the configuration chain until the configuration chain is covered by a next written configuration chain, and after all the configuration chains are written, the configuration buffer stores the lastest configuration chain, i.e., the configuration chain N; and then after all the configuration bitstreams are written and before the FPGA runs the user design normally, the control circuit reads the key configuration chain and writes the key configuration chain into the configuration buffer to cover the lastest configuration chain. As shown in FIG. 2, the configuration chain 3 is read and then is written into the configuration buffer to cover the configuration chain N, so that the configuration buffer stores the key configuration chain. In this case, because the configuration bitstreams have just been downloaded without an error, the key configuration chain stored in the configuration buffer is also correct. This implementation may allow the configuration buffer to store the key configuration chain, but has higher costs than that of the first implementation due to an additional circuit structure.

Because the configuration buffer stores the correct key configuration chain, when the FPGA runs the user design normally, a key configuration chain in the configuration memory may be updated by using the correct key configuration chain in the configuration buffer, to ensure accuracy and reliability of the key configuration chain in the configuration memory. In addition, in this process, the accuracy of the key configuration chain stored in the configuration buffer needs to be ensured. Therefore, in the present application, the configuration buffer has an ECC check function. When the FPGA runs the user design normally, the configuration buffer performs ECC check on the stored key configuration chain, and ECC check may be performed at an interval of a period of time. To implement ECC check, the configuration buffer actually further includes a corresponding check code generated according to an ECC algorithm in addition to storing the key configuration chain, and a width of the check code is determined according to a specification of ECC encoding and is related to a quantity of bits of the key configuration chain. For example, because a conventional requirement is single error detection and single error correction, when a bit width of a key configuration chain is 1024, a bit width of a corresponding check code is 11, and when a bit width of a key configuration chain is 2048, a bit width of a corresponding check code is 12, so that single error detection and single error correction are performed on the key configuration chain by using the check code. However, if a function of double error detection and single error correction needs to be implemented, one bit of check code may be increased, i.e., when the bit width of the key configuration chain is 1024, the bit width of the corresponding check code is 12. Therefore, a memory space of the configuration buffer is greater than at least a total memory space required by the key configuration chain and the check code corresponding to the key configuration chain. During actual operation, the memory space of the configuration buffer should match a write and read bandwidth of the configuration buffer, to ensure continuous operation, thereby improving read and write efficiency. The configuration buffer having the ECC check function has two implementations:

Implementation 1: the configuration buffer is implemented by a dedicated ECC memory. As shown in FIG. 2, the ECC memory stores a key configuration chain and a corresponding check code. During actual implementation, after all the configuration bitstreams are written and before the FPGA runs the user design normally, the ECC memory may perform ECC encoding on the stored key configuration chain, to generate the corresponding check code for storage. In addition, when the FPGA runs the user design normally, the ECC memory performs ECC check on the key configuration chain periodically through a self-contained ECC check function, corrects an error when detecting that the key configuration chain and/or the check has a fault, and over-writes the key configuration chain for storage.

Implementation 2: the configuration buffer is implemented by a common memory and an ECC error detection and correction circuit. As shown in FIG. 1, the memory is configured to store a key configuration chain and a corresponding check code. During actual implementation, after all the configuration bitstreams are written and before the FPGA runs the user design normally, the ECC error detection and correction circuit may perform ECC encoding on the key configuration chain stored in the memory, to generate the corresponding check code that is stored in the memory. When the FPGA runs the user design normally, the ECC error detection and correction circuit reads the key configuration chain and the check code corresponding to the key configuration chain from the memory for check, corrects an error when detecting that the key configuration chain and/or the check has a fault, and over-writes the key configuration chain and the check code into the memory.

In the two implementations, the used ECC encoding is implemented based on a Hamming code, and a Hamming distance is at least 3. Through the mechanism, it can be ensured that the configuration buffer always stores a correct key configuration chain. When the FPGA runs the user design normally, the control circuit reads the key configuration chain in the configuration buffer at an interval of a predetermined time and write the key configuration chain into a configuration block corresponding to the key configuration chain to update the key configuration chain, and the key configuration chain in the configuration buffer is not affected when being read, so that it can be ensured that the configuration bit content of the key configuration chain maintains an original written value without being affected by a running condition and an external environment factor.

Optionally, the FPGA further includes a timer connected to the control circuit. The control circuit updates the key configuration chain according to a delay duration of the timer, and an input clock of the timer comes from the outside of the FPGA or from the inside of the FPGA. When the input clock of the timer comes from the inside of the FPGA, in an embodiment, the input clock of the timer comes from a ring oscillator inside the FPGA, and a frequency of the input clock is adjustable. The delay duration of the timer may be customized according to an actual requirement. In an embodiment, the delay duration of the timer is less than a designed index parameter of the FPGA, and the designed index parameter includes at least one of a mean time between failures (MTBF) or a mean time to failure (MTTF), so that error correction can be performed automatically before a predetermined system fails. In another embodiment, when the timer triggers the control circuit according to the delay duration, the timer no longer performs delay calculation continuously but immediately triggers the control circuit to read the key configuration chain in the configuration buffer and write the key configuration chain into a configuration block corresponding to the key configuration chain to update the key configuration chain when the timer receives an immediate enable signal, where the immediate enable signal comes from the outside of the FPGA or from the user design inside the FPGA.

In another embodiment, the control circuit is connected to a built-in boundary scan chain of the FPGA, and the control circuit obtains an external control signal of the FPGA through the built-in boundary scan chain and reads a key configuration chain in the configuration buffer and writes the key configuration chain into a configuration block corresponding to the key configuration chain to update the key configuration chain.

What is claimed is:

1. A field programmable gate array (FPGA) for improving reliability of a key configuration bitstream by reusing a configuration buffer, comprising a configuration buffer, a configuration memory and a control circuit, wherein
the configuration memory comprises N configuration blocks, the configuration buffer has an error correcting code (ECC) check function, and the configuration buffer is connected to write terminals of the N configuration blocks, where N is an integer greater than or equal to 1;
configuration bitstreams corresponding to a user design are sequentially written into the FPGA in a unit of a configuration chain, each configuration chain comprises continuous configuration bits with a predetermined quantity of bits in the configuration bitstream s, and the configuration bitstreams comprise a key configuration chain set in advance;
after each configuration chain is over-written into the configuration buffer for caching, each configuration chain is written into a configuration block corresponding to each configuration chain in the configuration memory for storage, and after all the configuration bitstreams are written and before the FPGA runs the user design normally, the configuration buffer stores the key configuration chain; and
when the FPGA runs the user design normally, the configuration buffer performs ECC check on the key configuration chain, the control circuit reads the key configuration chain in the configuration buffer at an interval of a predetermined time and writes the key configuration chain into the configuration block corresponding to the key configuration chain to update the key configuration chain.

2. The FPGA according to claim 1, wherein
when the configuration bitstreams are written into the FPGA, a lastest written configuration chain is the key configuration chain;
when each configuration chain is written into the configuration block corresponding to each configuration chain from the configuration buffer, the configuration buffer stores the configuration chain until the configuration chain is covered by a next written configuration chain; and
after all configuration chains are written, the configuration buffer stores the lastest configuration chain and the lastest configuration chain is directly used as the key configuration chain.

3. The FPGA according to claim 1, wherein
the configuration buffer is at least connected to a read terminal of a configuration block storing the key configuration chain;
when each configuration chain is written into the configuration block corresponding to each configuration chain from the configuration buffer, the configuration buffer stores the configuration chain until the configuration chain is covered by a next written configuration chain, and after all configuration chains are written, the configuration buffer stores a lastest configuration chain; and
after all the configuration bitstreams are written and before the FPGA runs the user design normally, the control circuit reads the key configuration chain and writes the key configuration chain into the configuration buffer to cover the lastest configuration chain.

4. The FPGA according to claim 1, wherein
the configuration buffer is implemented by an ECC memory, the ECC memory stores the key configuration chain and a check code corresponding to the key configuration chain and performs ECC check on the key configuration chain through a self-contained ECC check function.

5. The FPGA according to claim 1, wherein
the configuration buffer is implemented by a memory and an ECC error detection and correction circuit, the memory is configured to store the key configuration chain and a check code corresponding to the key configuration chain; and the ECC error detection and correction circuit reads the key configuration chain and the check code corresponding to the key configuration chain from the memory for checking, corrects an error when a fault is detected, and over-writes the key configuration chain and the check code into the memory.

6. The FPGA according to claim 1, further comprising a timer connected to the control circuit, wherein
the control circuit updates the key configuration chain according to a delay duration of the timer, and an input clock of the timer comes from outside of the FPGA or from inside of the FPGA.

7. The FPGA according to claim 6, wherein
when the timer receives an immediate enable signal, the timer immediately triggers the control circuit to update the key configuration chain, wherein the immediate enable signal comes from outside of the FPGA, or the immediate enable signal comes from the user design inside the FPGA.

8. The FPGA according to claim 6, wherein
the delay duration of the timer is less than a designed index parameter of the FPGA, and the designed index parameter comprises at least one of a mean time between failures (MTBF) or a mean time to failure (MTTF).

9. The FPGA according to claim 6, wherein
the input clock of the timer comes from a ring oscillator inside the FPGA, and a frequency of the input clock is adjustable.

10. The FPGA according to claim 1, wherein
the control circuit is connected to a built-in boundary scan chain of the FPGA, and the control circuit obtains an external control signal of the FPGA through the built-in boundary scan chain and updates the key configuration chain.

11. The FPGA according to claim 1, wherein the ECC check function of the configuration buffer is implemented based on a Hamming code.

* * * * *